(12) United States Patent
Bradley et al.

(10) Patent No.: US 8,902,020 B2
(45) Date of Patent: Dec. 2, 2014

(54) RESONATOR FILTER WITH MULTIPLE CROSS-COUPLINGS

(75) Inventors: Paul Bradley, Los Altos, CA (US); Shen Ye, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 823 days.

(21) Appl. No.: 12/694,645

(22) Filed: Jan. 27, 2010

(65) Prior Publication Data

US 2011/0018654 A1      Jan. 27, 2011

Related U.S. Application Data

(63) Continuation-in-part of application No. 12/509,863, filed on Jul. 27, 2009, now Pat. No. 8,063,717.

(51) Int. Cl.
*H03H 9/00* (2006.01)
*H03H 9/70* (2006.01)
*H03H 9/72* (2006.01)

(52) U.S. Cl.
CPC ............... *H03H 9/706* (2013.01); *H03H 9/725* (2013.01)
USPC .......................................... 333/133; 333/195

(58) Field of Classification Search
USPC .................. 333/133, 187, 189, 191, 192, 193
See application file for complete search history.

(56) References Cited

U.S. PATENT DOCUMENTS

| | | | |
|---|---|---|---|
| 5,654,680 A * | 8/1997 | Kwan et al. | 333/195 |
| 5,929,724 A | 7/1999 | D'Souza | |
| 6,369,672 B1 | 4/2002 | Ikada | |
| 6,384,697 B1 | 5/2002 | Ruby | |
| 6,724,279 B1 | 4/2004 | Kitajima et al. | |
| 6,903,631 B2 | 6/2005 | Kushitani et al. | |
| 6,924,715 B2 | 8/2005 | Beaudin et al. | |
| 6,927,649 B2 | 8/2005 | Metzger et al. | |
| 7,098,758 B2 | 8/2006 | Wang et al. | |
| 7,116,187 B2 | 10/2006 | Inoue | |
| 7,301,420 B2 * | 11/2007 | Yamaguchi et al. | 333/133 |
| 7,479,847 B2 * | 1/2009 | Yamakawa et al. | 333/133 |
| 7,498,899 B2 | 3/2009 | Iwaki et al. | |
| 7,501,912 B2 | 3/2009 | Jamneala | |
| 7,821,357 B2 | 10/2010 | Heinze et al. | |
| 2002/0158708 A1 * | 10/2002 | Inoue et al. | 333/133 |
| 2005/0073375 A1 | 4/2005 | Sul et al. | |
| 2006/0139121 A1 | 6/2006 | Jhung | |

(Continued)

FOREIGN PATENT DOCUMENTS

WO      WO2006022672 A1      3/2006

OTHER PUBLICATIONS

Xinen Zhu "Switchable and Tunable Ferroelectric Thin Film Radio Frequency Components", The University of Michigan 2009, pp. 1-127. http://deepblue.lib.umich.edu/bitstream/2027.42/62366/1/zhuxinen_1.pdf.

*Primary Examiner* — Dean O Takaoka

(57) ABSTRACT

A filter device is provided for filtering signals. The filter device includes multiple series resonators, multiple shunt resonators and multiple cross-coupling circuits. The series resonators are connected in series between an antenna and one of a transmitter or a receiver. The shunt resonators are respectively connected between at least one of the series resonators and a ground voltage. The cross-coupling circuits are configured to bypass at least two series resonators of the multiple series resonators and at least one shunt resonator of the multiple shunt resonators.

21 Claims, 13 Drawing Sheets

(56) References Cited

U.S. PATENT DOCUMENTS

| | | |
|---|---|---|
| 2007/0046395 A1 | 3/2007 | Tsutsumi et al. |
| 2008/0100397 A1 | 5/2008 | Nam et al. |
| 2008/0309430 A1 | 12/2008 | Tsuzuki et al. |
| 2009/0002102 A1 | 1/2009 | Tsuzuki et al. |
| 2009/0079520 A1 | 3/2009 | Jamneala et al. |
| 2011/0018654 A1 | 1/2011 | Bradley et al. |

* cited by examiner

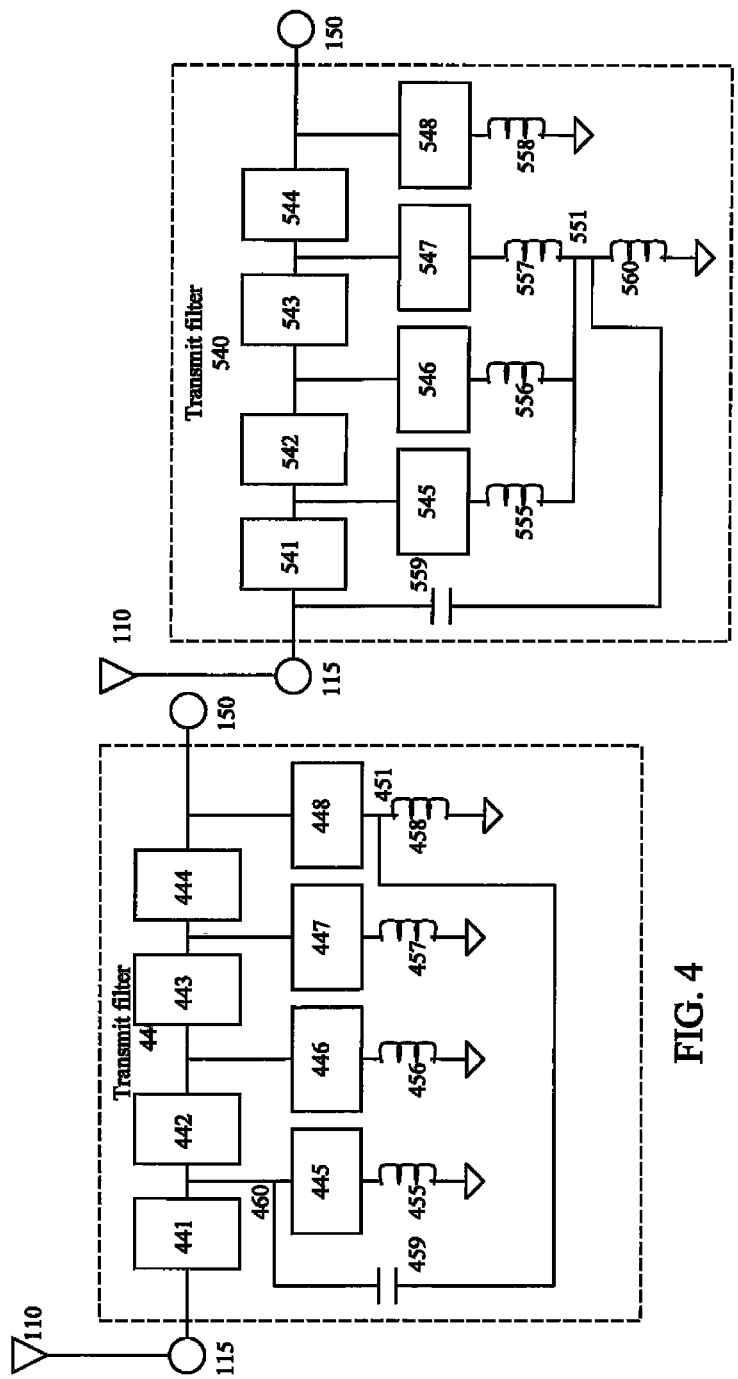

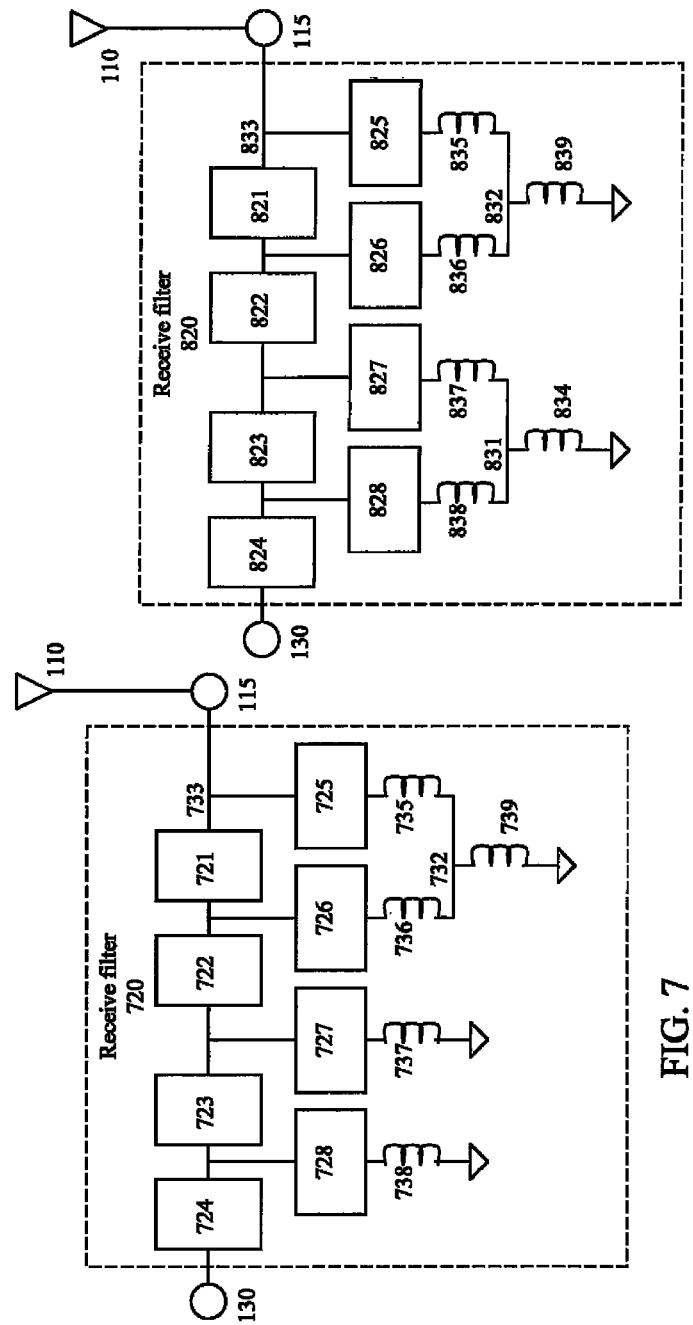

RESONATOR FILTER WITH MULTIPLE CROSS-COUPLINGS

The present application is a continuation-in-part of U.S. Pat. No. 8,063,717 filed in the United States Patent and Trademark Office on Jul. 27, 2009, the subject matter of which is hereby incorporated by reference.

BACKGROUND

Portable communication devices, such as cellular telephones, personal digital assistants (PDAs), electronic gaming devices, laptop computers and the like, are configured to communicate over wireless networks. Accordingly, each such portable communication device relies on a transmitter and receiver (or transceiver), typically connected to a single or common antenna, for sending and receiving data and control signals over the wireless network. In order to use the common antenna, a duplexer is included to interface between the common antenna and each of the transmitter and receiver, so that the transmitter is able to send signals on a transmit frequency and the receiver is able to receive signals on a different receive frequency. Generally, the duplexer includes two band-pass filters having different passbands for filtering the transmit and receive signals, respectively, thus preventing or reducing interference between the transmit and receive signals.

Various types of wireless network are implemented according to different communication standards, such as universal mobile telecommunications system (UMTS), global system for mobile communication (GSM), personal communications services (PCS), digital cellular system (DCS), international mobile telecommunication (IMT), and enhanced data rates for GSM evolution (EDGE). The communication standards identify separate bands for transmitting (uplink) and receiving (downlink) signals. For example, UMTS band 2 (PCS) provides an uplink frequency band of 1850 MHz-1910 MHz and a downlink frequency band of 1930 MHz-1990 MHz; UMTS band 3 (DCS) provides an uplink frequency band of 1710 MHz-1785 MHz and a downlink frequency band of 1805 MHz-1880 MHz; UMTS band 7 (IMT-E) provides an uplink frequency band of 2500 MHz-2570 MHz and a downlink frequency band of 2620 MHz-2690 MHz; and UMTS band 8 (GMS-900) provides an uplink frequency band of 880 MHz-915 MHz and a downlink frequency band of 925 MHz-960 MHz. Accordingly, a duplexer operating in compliance with a UMTS standard would include a transmit filter having a passband within the corresponding uplink frequency band, and a receive filter having a passband within the corresponding downlink frequency band.

Demand for smaller, less expensive and more efficient portable communication devices is significant. Therefore, reducing size and weight of portable communication devices, as well as reducing fabrication costs and increasing product yield, are priorities. For example, there is demand for the band-pass filters of duplexers in portable communication devices to be smaller, to consume less power, to have improved performance characteristics (such as lower insertion loss and higher out-of-band attenuation), and to operate at higher frequencies. Such duplexers may include resonators for filtering the transmit and receive signals, such as a thin film bulk acoustic resonators (FBARs). However, design and fabrication are difficult, e.g., due to passband and stopband requirements of the corresponding receive and transmit band-pass filters, and matching circuit requirements between the band-pass filters and the antenna.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 4 is a circuit diagram illustrating a transmit resonator filter, according to a representative embodiment.

FIG. 5 is a circuit diagram illustrating a transmit resonator filter, according to a representative embodiment.

FIG. 7 is a circuit diagram illustrating a receive resonator filter, according to a representative embodiment.

FIG. 8 is a circuit diagram illustrating a receive resonator filter having multiple cross-coupling inductors, according to a representative embodiment.

DETAILED DESCRIPTION

Figure 1:
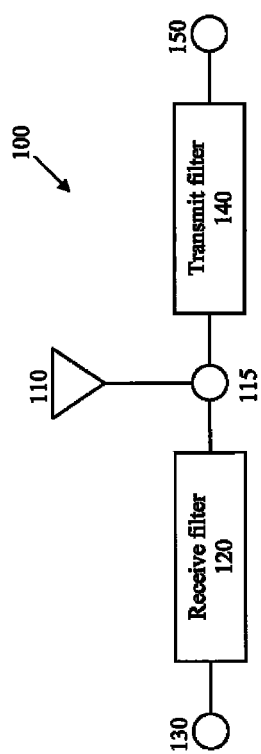
FIG. 1 is a block diagram illustrating a duplexer with resonator filters, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

FIG. 1 is a block diagram illustrating a duplexer having resonator band-pass filters, according to a representative embodiment.

Referring to FIG. 1, duplexer 100 interfaces a receiver (not shown) and a transmitter (not shown) with a common antenna 110, for receiving and sending wireless communications signals. The wireless communications signals may be radio frequency (RF) signals, for example, complying with various communication standards, examples of which are discussed above.

In the depicted representative embodiment, the duplexer 100 includes receive filter 120 connected between the receiver through receiver terminal 130 and antenna 110 through antenna terminal 115, and transmit filter 140 connected between the transmitter through transmitter terminal 150 and the antenna terminal 115 through the antenna terminal 115. The receive filter 120 band-pass filters downlink signals passing through the antenna 110 to the receiver, and the transmit filter 140 band-pass filters uplink signals sent from the transmitter through the antenna 110. The duplexer 100 may be incorporated into any type of portable communication device, such as a cellular telephone, PDA, electronic gaming device, laptop computer and the like.

Figure 2:
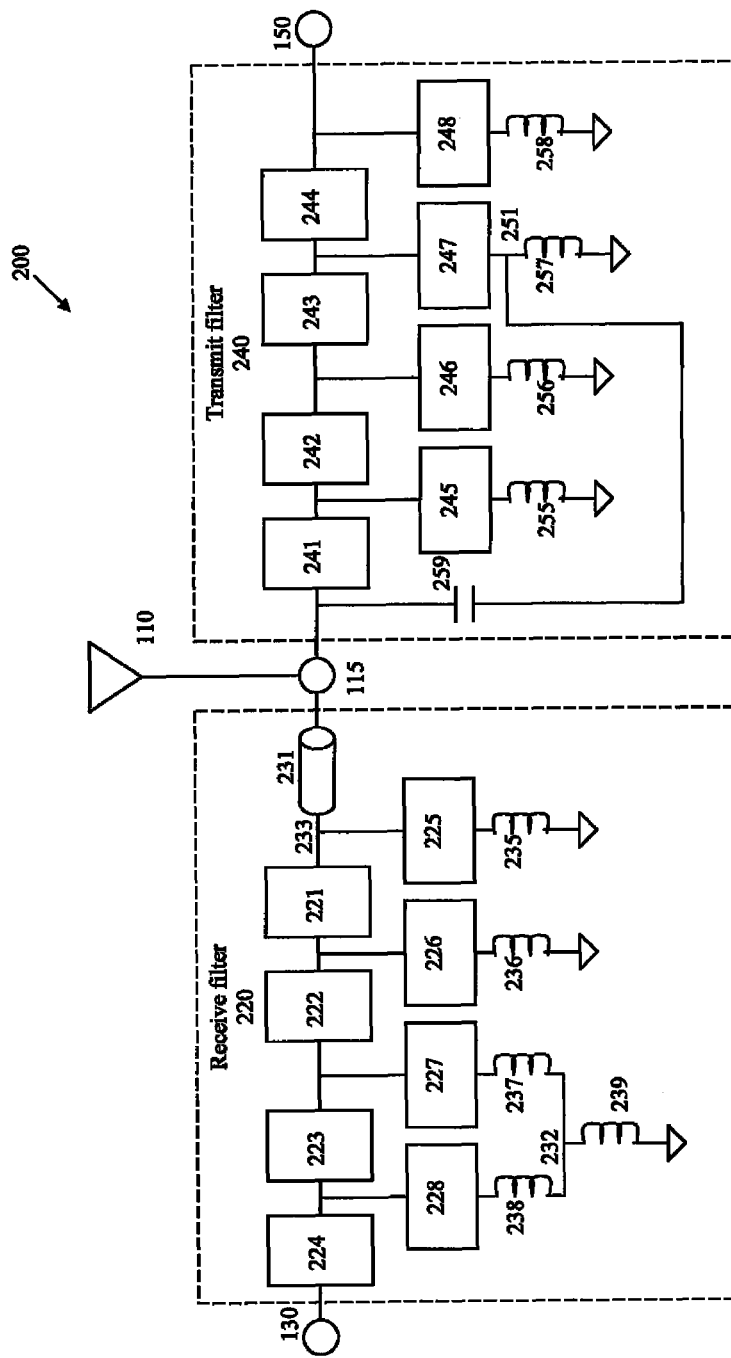
FIG. 2 is a circuit diagram illustrating a duplexer with transmit and receive resonator filters, according to a representative embodiment.

FIG. 2 is a circuit diagram illustrating the duplexer having illustrative first and second resonator band-pass filters, as discussed with reference to in FIG. 1, according to a representative embodiment.

More particularly, duplexer 200 is shown as including a first filter, referred to for convenience of discussion as transmit filter 240, and a second filter, referred to for convenience of discussion as receive filter 220, each of the first and second filters having half-ladder topology. It is understood that in various embodiments, the first and second filters may be reversed, such that the first filter is a receive filter, e.g., connected to a receiver, and the second filter is a transmit filter, e.g., connected to a transmitter, without departing from the scope of the disclosure.

The transmit and receive filters 240 and 220 are configured with resonators 241-248 and 221-228, respectively, according to the depicted embodiments. It is understood, however, that alternative embodiments of the duplexer 200 may include other configurations of transmit and receive filters, for example, as shown in FIGS. 4, 5, 6A, 6B, 10A, 10B and 11 (depicting representative embodiments of transmit filters 440, 540, 640a, 640b, 1040a, 1040b and 1140, respectively), and in FIGS. 7, 8, 9A and 9B (depicting representative embodiments of receive filters 720, 820, 920a and 920b, respectively), without departing from the scope of the present teachings. It is further understood that alternative embodiments of the duplexer 200 may combine any representative embodiment of transmit filter with any representative embodiment of the receive filter.

Referring to FIG. 2, the receive filter 220 is a ladder type filter having multiple series and shunt resonators 221-228 (discussed below). Each of the series and shunt resonators 221-228 may be a bulk acoustic wave (BAW) resonator such as a film bulk acoustic resonator (FBAR) or a solidly mounted resonator (SMR), for example, and includes a thin film piezoelectric layer formed in a stacked structure between top and bottom electrodes. The thin film piezoelectric layer may be formed of a material such as aluminum nitride (AlN), lead zirconate titanate (PZT), or other film compatible with semiconductor processes. In an embodiment, the receive series and shunt resonators 221-228 are fabricated using a common layer of piezoelectric material. The top and bottom electrodes may be formed of any conductive metal compatible with semiconductor processes, such as molybdenum, tungsten, aluminum or the like. Alternatively, each of the series and shunt resonators 221-228 may be a surface acoustic wave (SAW) resonator. In addition to being incorporated into a duplexer, the receive filter 220 may be used as stand alone band-pass filter or may be incorporated in multiplexers or other devices. The receive filter 220 has a series circuit including phase shifter 231 and first through fourth series resonators 221-224 connected in series between the antenna terminal 115 and the receiver terminal 230. The phase shifter 231 is configured to provide phase shifting between 60 and 120 degrees, depending on the half-ladder filter characteristics of the receive and transmit filters 220 and 240 in the duplexer 200. In various embodiments, the phase shifter 231 may be replaced by shunt inductance matching circuit (not shown), for example, where the downlink and uplink frequency bands are more than about 1 percent apart. The receive filter 220 also has shunt circuits which respectively include first through fourth shunt resonators 225-228 and corresponding first through fourth inductors 235-238 generally connected between the series circuit and ground voltage. In an embodiment, the series and shunt resonators 221-228 have the same coupling coefficient.

More particularly, in the depicted representative embodiment, first shunt resonator 225 has one end (e.g., top electrode) connected between the phase shifter 231 and first series resonator 221 at node 233 and an opposite end (e.g., bottom electrode) connected to ground through fourth inductor 235. Second shunt resonator 226 has one end connected between first and second series resonators 221 and 222 and an opposite end connected to ground through inductor 236. Third shunt resonator 227 has one end connected between second and third series resonators 222 and 223 and an opposite end connected to mutual inductance node 232 through inductor 237. Similarly, fourth shunt resonator 228, which is connected closest to the receiver terminal 230, has one end connected between third and fourth series resonators 223 and 224 and an opposite end connected to the mutual inductance node 232 through inductor 238. The mutual inductance node 232 is connected to ground through mutual or common ground inductor 239, which is a cross-coupling inductor. In various embodiments, the common ground inductor 239 may be replaced by another mutual inductance between current paths of adjacent shunt resonators from among the first through fourth shunt resonators 225-228. Examples of alternative configurations are discussed below with reference to FIGS. 7, 8, 9A and 9B.

The transmit filter 240 is also a ladder type filter, having multiple series and shunt resonators 241-248 (discussed below). Each of the series and shunt resonators 241-248 may be an FBAR, for example, including a thin film piezoelectric layer formed in a stacked structure between top and bottom electrodes. The thin film piezoelectric layer may be formed of a material such as aluminum nitride, PZT or other film compatible with semiconductor processes. In an embodiment, the series and shunt resonators 241-248 are fabricated using a common layer of piezoelectric material. Also, in an embodiment, the series and shunt resonators 241-248, as well as the series and shunt resonators 221-228 of the receive filter 220, may be fabricated using a common layer of piezoelectric material. The top and bottom electrodes may be formed of any conductive metal compatible with semiconductor processes, such as molybdenum, tungsten, aluminum or the like. In addition to being incorporated into a duplexer, the transmit filter 240 may be used as stand alone band-pass filter or may be incorporated in multiplexers or other devices.

The transmit filter 240 has a series circuit including first through fourth transmit filter series resonators 241-244 connected in series between the antenna terminal 115 and the transmitter terminal 150. The transmit filter 240 also has shunt circuits which respectively include first through fourth shunt resonators 245-248 and corresponding first through fourth inductors 255-258 generally connected between the series circuit and ground voltage. In an embodiment, the series and shunt resonators 241-248 of the transmit filter 240 have the same coupling coefficient, which may or may not also be the same coupling coefficient as the series and shunt resonators 221-228 of the receive filter 220. Use of minimum coupling coefficients with respect to series and shunt resonators 221-228 and/or 241-248 enables reduction in die size.

More particularly, in the depicted representative embodiment, first shunt resonator 245 has one end (e.g., top electrode) connected between first and second series resonators 241 and 242, and an opposite end (e.g., bottom electrode) connected to ground through inductor 255. Second shunt resonator 246 has one end connected between second and third series resonators 242 and 243 and an opposite end connected to ground through inductor 256. Third shunt resonator 247 has one end connected between third and fourth series resonators 243 and 244 and an opposite end connected to capacitance node 251. The capacitance node 251 is connected to ground through inductor 257 and to the antenna terminal 115 through cross-coupling capacitor 259. Fourth shunt resonator 248, which is connected closest to the transmitter terminal 150, has one end connected between fourth series resonator 244 and the transmitter terminal 150, and an opposite end connected to ground through inductor 258.

Stated more generally, in various embodiments, the cross-coupling capacitor 259 is connected between one of a first node connected to at least one of the series resonators 241-244 (e.g., series resonator 241) and a second node connected to one of the first through fourth shunt resonators 245-248 (e.g., third shunt resonator 247). Between the first and second nodes, there are three series resonators (e.g., series resonators 241-243) and one shunt resonator (e.g., shunt resonator 247). The second node (e.g., capacitance node 251) is separated from the ground voltage by an inductor (e.g., inductor 257). Examples of alternative configurations are discussed below with reference to FIGS. 4, 5, 6A, 6B, 10A, 10B and 11.

In an embodiment, the common ground inductor 239 and/or the inductors 235-238 of the receive filter 220 are fabricated on a common substrate with the receive series and shunt resonators 221-228, but these inductors could also be implemented as traces on an organic or ceramic substrate with or without wirebonds. Likewise, in an embodiment, the cross-coupling capacitor 259 and/or the inductors 255-258 of the transmit filter 240 are fabricated on a common substrate with the transmit series and the shunt resonators 241-248, which may or may not be the same common substrate of the receive filter 220. The inductors may also be implemented on an organic or ceramic substrate with or without wire bonds. Also, in an embodiment, the receive and transmit filters 220 and 240 are integrally mounted in the same package.

The center frequencies of the passbands for the receive filter 220 and the transmit filter 240 are offset from one another, reducing or avoiding overlap of the respective passbands. The center frequencies are selected to be within the downlink and uplink frequency bands of the applicable communication standard, respectively. For example, in accordance with the GSM-900 standard, the available frequency band for the receive filter 220 is 925 MHz-960 MHz and the available frequency band for transmit filter 240 is 880 MHz-915 MHz. Thus, for purposes of illustration only, it may be assumed that the passband center frequency of the receive filter 220 is about 943.3 MHz and the passband center frequency of the transmit filter 240 is about 887.2 MHz. However, it is understood that the various embodiments may incorporate different standards, or may include different center frequencies and/or passbands in accordance with the GSM-900 standard, without departing from the scope of the present teachings.

Referring again to FIG. 2, the common ground inductor 239 of the receive filter 220 shifts a transmission zero of the received (downlink) signal downward, below the passband of the receive filter 220, into the middle of its stopband. The value of the common ground inductor 239 determines how far the transmission zero is shifted down in frequency from the passband edge. For example, in an embodiment, the value of the common ground inductor 239 is selected such that the transmission zero will be shifted to at or near the center frequency of the passband of the transmit filter 240.

Similarly, the cross-coupling capacitor 259 of the transmit filter 240, together with the third inductor 257, shifts a transmission zero of the transmitted (uplink) signal higher, above the passband of the transmit filter 240, into the middle of its stopband. The values of the cross-coupling capacitor 259 and the third inductor 257 determine how far the transmission zero is shifted upward in frequency from the upper passband edge. For example, in an embodiment, the values of the cross-coupling capacitor 259 and/or the third inductor 257 are selected such that the transmission zero will be shifted to be at or near the center frequency of the passband of the receive filter 220. This frequency placement of transmission zeroes (and poles) of the receive and transmit filters 220 and 240 achieves near-ideal elliptic filter performance of the duplexer 200.

It is understood that the filter configurations (depicted in FIG. 2, as well as in FIGS. 4-11, discussed below) may be included in either transmit or receive filters, without departing from the scope of the present teachings, to provide unique benefits for any particular situation or to meet application specific design requirements of various implementations, as would be apparent to one skilled in the art. For example, in the representative embodiment depicted in FIG. 2, it is assumed for purposes of discussion that the passband center frequency of the downlink frequency band of the received signal is higher than the passband center frequency of the uplink frequency band of the transmitted signal. Therefore, the cross-coupling capacitor 259 is shown as part of the transmit filter 240, since it shifts a transmission zero of a signal higher (toward the downlink frequency band), and common ground inductor 239 is shown as part of the receive filter 220, since it shifts a transmission zero of a signal lower (toward the uplink frequency band).

However, it is understood that in various alternative embodiments and/or configurations, the passband center frequency of the uplink frequency band may be higher than the passband center frequency of the downlink frequency band, for example, in compliance with 3GPP Bands 13 and 14. In this case, a first filter having substantially the same configuration as the transmit filter 240 would be the receive filter, connected between the receiver terminal 130 and the antenna terminal 115, for shifting a transmission zero of the downlink signal higher. Likewise, a second filter having substantially the same configuration as the receive filter 220 would be the transmit filter, connected between the transmitter terminal 150 and the antenna terminal 115, for shifting a transmission zero of the uplink signal lower.

Further, according to various embodiments, the duplexer 200 does not require any inductors larger than wirebond inductance external to the receive and transmit filters 220 and 240, but they may be used as matching elements to allow better performance for filters with constrained area to reduce die cost. For example, the maximum shunt resonator inductor is not more than about 0.7 nH, while in conventional duplexers, values as large as 3-4 nH are used. Accordingly, the size of the duplexer 200 (and/or receive and transmit filters 220 and 240) is smaller, and out-of-band rejection and in-band insertion loss are improved over resonator filters of conventional duplexers. Further, due to the elimination of the performance variation caused by external inductors, the configuration of the duplexer 200 will result in increased product yields.

Figure 3A:
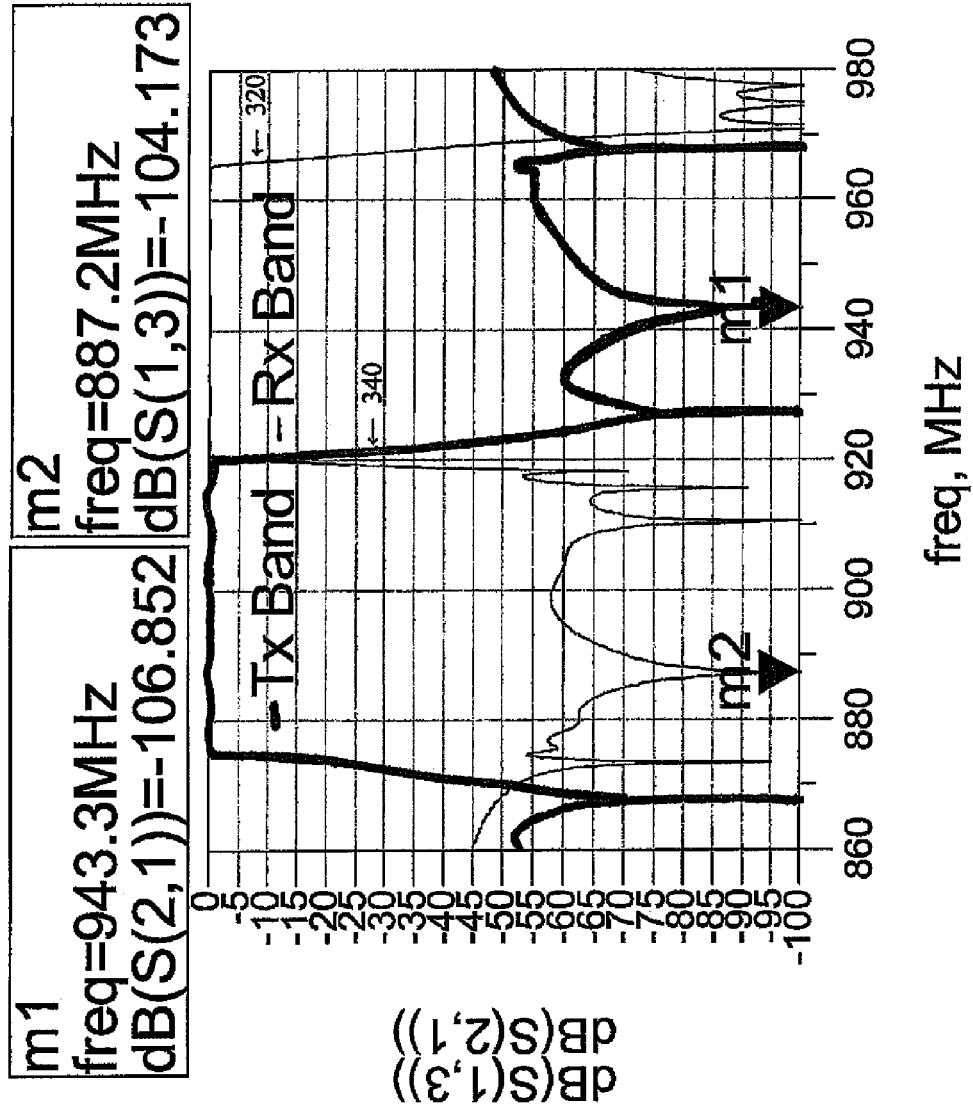
FIG. 3A is a signal diagram illustrating a simulated duplexer performance with cross-coupling elements, according to a representative embodiment.

FIG. 3A is a signal diagram illustrating simulated duplexer performance, showing representative frequency responses of the receive filter 220 and the transmit filter 240, according to a representative embodiment, assuming high quality factor resonators for illustrative purposes, with the cross-coupling elements for transmission zero shifting in the frequency response.

More particularly, FIG. 3A corresponds to an illustrative configuration of the duplexer 200 shown in FIG. 2, in which the common ground inductor 239 has a value of about 0.76 nH and the cross-coupling capacitor 259 has a value of about 0.53 pF. Also, the center frequency of the passband of the receive filter is assumed to be about 943.3 MHz and the center frequency of the passband of the transmit filter 240 is assumed to be about 887.2 MHz. The values of the inductors 235-238 may be between about 0.3 nH and 0.7 nH (typical wirebond values), and the values of the inductors 255-258 are in the same range. Each of the resonators 221-228 and 241-248 may be an FBAR, having areas in the range of about 1000-100,000 square microns, depending on the frequency and bandwidth requirements of the filters/duplexers and optimized impedance for each particular resonator. It is understood that, in various embodiments, the sizes and/or values of the resonators, inductors and cross-coupled capacitor may vary to provide unique benefits for any particular situation or to meet application specific design requirements of various implementations, as would be apparent to one skilled in the art.

Referring to FIG. 3A, curve 340 shows the frequency response of the transmit filter 240, according to a representative embodiment, indicating forward transmission gain $S_{21}$ (in dB) as a function of transmitted signal frequency (in MHz). The passband of the transmit filter 240 is about 870 MHz-920 MHz. Curve 320 shows the frequency response of the receive filter 220, indicating reverse transmission loss $S_{23}$ (in dB) as a function of received signal frequency (in MHz). The passband of the receive filter 220 is about 920 MHz-970 MHz. Curve 340 shows that a transmission zero following initial roll-off of the in-band frequency response has been shifted, by operation of the cross-coupling capacitor 259, to about 943.3 MHz (indicated by m1), which substantially coincides with the center frequency of the receive filter 220. In the depicted example, the out-of-band attenuation at m1 for the transmit filter 240 is −106.852 dB. Likewise, curve 320 shows that a transmission zero after initial roll-off of the in-band frequency response of the receive filter 220 has been shifted, by operation of the common ground inductor 239, to about 887.2 MHz (indicated by m2), which substantially coincides with the center frequency of the transmit filter 220. In the depicted example, the out-of-band attenuation at m2 for the receive filter 220 is −104.173 dB.

Figure 3B:
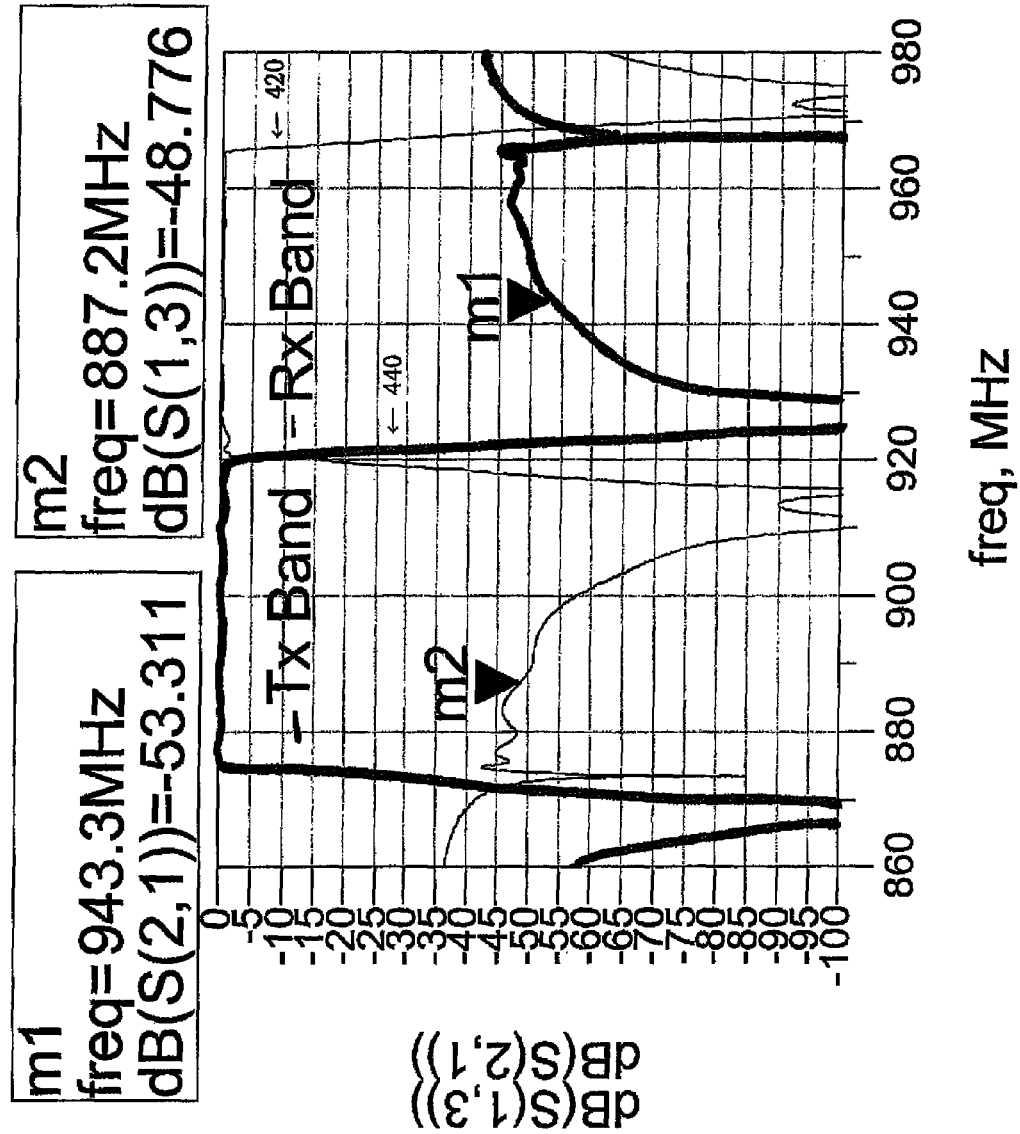
FIG. 3B is a signal diagram illustrating the simulated duplexer performance without the cross-coupling elements.

For purposes of comparison, FIG. 3B is a signal diagram illustrating simulated duplexer performance, showing representative frequency responses of receive and transmit filters, configured substantially the same as receive and transmit filters 220 and 240, as discussed above with reference to FIG. 3A, but without the cross-coupling elements, e.g., common ground inductor 239 and cross-coupling capacitor 259, respectively, that shift transmission zeroes to the middle of the rejection bands.

Curve 420 shows that a transmission zero following initial roll-off of the in-band frequency response occurs at about 928 MHz, which is at the edge of the passband of the receive filter 220. Meanwhile, the frequency response of the transmit filter 240 at the center frequency of the receive filter 220 (indicated by m1) is significantly higher, with an out-of-band attenuation of −53.311 dB. Curve 420 shows that a transmission zero following initial roll-off of the in-band frequency response occurs at about 910 MHz, which is at the edge of the passband of the transmit filter 240. Meanwhile, the frequency response of the receive filter 220 at the center frequency of the transmit filter 240 (indicated by m2) is significantly higher, with an out-of-band attenuation of −48.776 dB. Thus, each of the receive filter 220 and the transmit filter 240 experiences large degradation in rejection level in the frequency of the other filter's passband.

The placement of the transmission zeros may be controlled by varying the respective values of the cross-coupling capacitor 259 and the common ground inductor 239, up to the corresponding centering values of 0.53 pF and 0.76 nH, as shown in FIG. 3A. That is, as the value of the cross-coupling capacitor 259 approaches 0.53 pF, the transmission zero moves upward, further into the stopband of the transmit filter 240 and the passband of the receive filter 220. Also, as the value of the common ground inductor 239 approaches 0.76 nH, the transmission zero moves downward further into the stopband of the receive filter 220 and the passband of the transmit filter 240. For example, at half values, where the cross-coupling capacitor 259 is about 0.26 pF and the common ground inductor 239 is about 0.38 nH, the frequency response of the transmit filter 240 at the center frequency of the receive filter 220 is about −59.684 dB and the frequency response of the receive filter 220 at the center frequency of the transmit filter 240 is about −54.576 dB.

Further, there are fewer manufacturing variables in fabricating the receive and transmit filters 220 and 240 than in conventional receive and transmit filters. Individual control over the resonator areas of resonators 221-228 and 241-248 and only two mass-loadings are needed to produce frequency shifts in some of the resonators. Mass loadings are deposited layers of material on specific resonators, depending on design, needed to move the corresponding resonant frequencies of these resonators. For example, in the representative embodiments of the receive and transmit filters 220 and 240 shown in FIG. 2, in addition to the coarse mass-loading used on all the shunt resonators, a second, much smaller mass-loading on the two middle series resonators (e.g., series resonators 242 and 243) and the first and last shunt resonators (e.g., first and fourth shunt resonators 245 and 248) of the transmit filter 240, and the two middle series resonators (e.g., second and third series resonators 222, 223) and the last shunt resonator (e.g., fourth shunt resonator 228) of the receive filter 220, suffice to give an extremely sharp transition from passband to stopband. Also, the representative design permits use of a minimum coupling coefficient for the required bandwidth, which enables a thinner piezoelectric layer and therefore smaller die sizes. Further, the same coupling coefficient may be used for all resonators 221-228 and 241-248 in the receive and transmit filters 220 and 240. It would otherwise be difficult to control relative resonator frequencies if different effective coupling coefficients on different resonators were needed, since piezoelectric layer thicknesses on resonators with different effective coupling constants must vary.

FIGS. 4 and 5 are circuit diagrams of transmit filters 440 and 540, respectively, according to additional representative embodiments. Like transmit filter 240, discussed above, transmit filters 440 and 540 are half-ladder filters with eight resonators and cross-coupling capacitors, and provide substantial rejection above passband, shifting transmission zeros further into the stopband. Transmit filters 240, 440 and 540 may also have fast roll-off on the high frequency side. Transmit filters 440 and 540 may be incorporated in duplexer 200, for example, in place of transmit filter 240. Transmit filters 440 and 450 may also be used as stand alone band-pass filters or may be incorporated in multiplexers or other devices.

Referring to FIG. 4, transmit filter 440 has a series circuit including first through fourth transmit filter series resonators 441-444 connected in series between the antenna terminal 115 and the transmitter terminal 150. The transmit filter 440 also has shunt circuits which respectively include first through fourth shunt resonators 445-448 and corresponding first through fourth inductors 455-458 generally connected between the series circuit and ground voltage. The series and shunt resonators 441-448, as well as the inductors 455-458, may substantially correspond to resonators 241-248 and inductors 255-258 discussed above with respect to FIG. 2, and thus the descriptions will not be repeated with respect to the transmit filter 440.

In the depicted representative embodiment, the transmit filter 440 includes a different connection of the cross-coupling capacitor than the transmit filter 240. In particular, fourth shunt resonator 448 has one end connected to the transmitter terminal 150 and an opposite end connected to first capacitance node 451, which is connected to ground through fourth inductor 458. The first capacitance node is also connected to second capacitance node 460 through cross-coupling capacitor 459. The second capacitance node 460 is located between first and second series resonators 411 and 442. First shunt resonator 445 has one end connected to the second capacitance node 460 and an opposite end connected to ground through first inductor 455.

Referring to FIG. 5, transmit filter 540 has a series circuit including first through fourth transmit filter series resonators 541-544 connected in series between the antenna terminal 115 and the transmitter terminal 150. The transmit filter 540 also has shunt circuits which respectively include first through fourth shunt resonators 545-548 and corresponding first through fourth inductors 555-558 generally connected between the series circuit and ground voltage. The transmit filter 540 further includes an additional inductor, fifth inductor 560, discussed below. The series and shunt resonators 541-548, as well as the first through fourth inductors 555-558, may substantially correspond to resonators 241-248 and inductors 255-258 discussed above with respect to FIG. 2, and thus the descriptions will not be repeated with respect to the transmit filter 540.

In the depicted representative embodiment, the transmit filter 540 includes yet another connection of the cross-coupling capacitor, different than that of the transmit filter 240. In particular, third shunt resonator 547 has one end connected between third and forth series resonators 543 and 544 and an opposite end connected to capacitance node 551 through fourth inductor 558. The capacitance node 551 is connected to ground through fifth inductor 460 and to the antenna terminal 115 through cross-coupling capacitor 559. In addition, the capacitance node 551 is also connected to first and second shunt resonators 545 and 546 through first and second inductors 555 and 556, respectively.

Figure 6A:
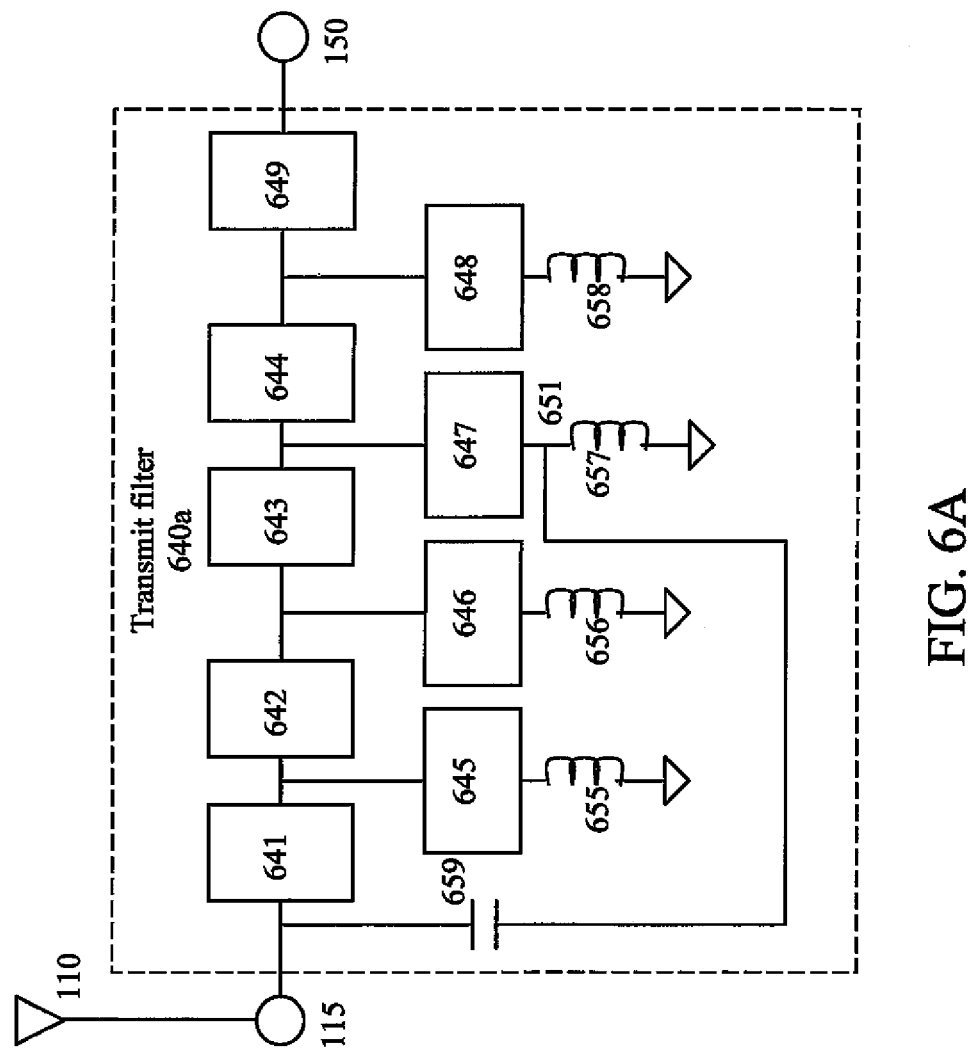
FIGS. 6A and 6B are circuit diagrams illustrating transmit resonator filters having nine resonators, according to representative embodiments.
Figure 6B:
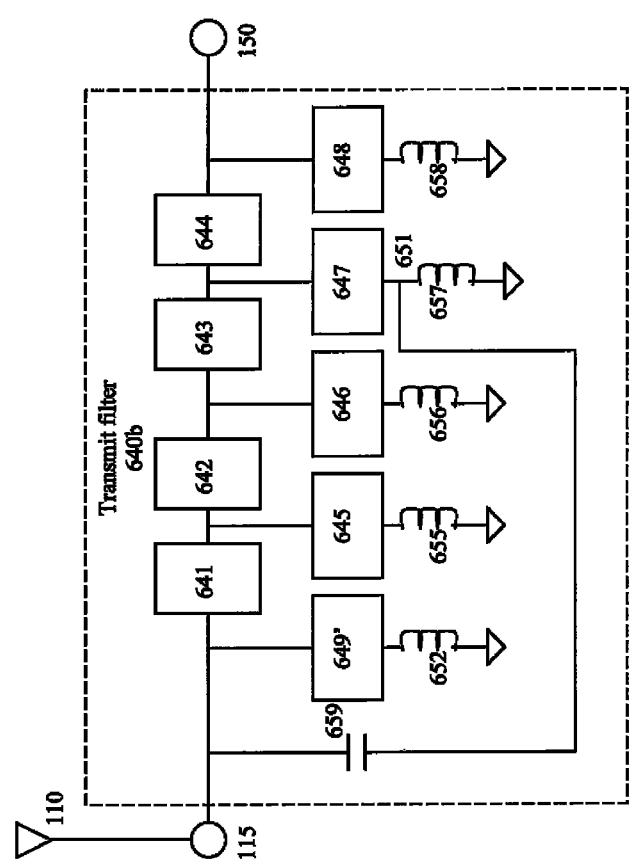

FIGS. 6A and 6B are circuit diagrams of transmit filters 640a and 640b, respectively, according to representative embodiments. Transmit filters 640a and 640b are half-ladder filters, similar to the transmit filter 240, discussed above with reference to FIG. 2, except that each includes an additional (ninth) resonator.

More particularly, referring to FIG. 6A, transmit filter 640a includes additional series resonator 649, which is connected in the series circuit between fourth series resonator 644 and transmitter terminal 150. Referring to FIG. 6B, transmit filter 640b includes additional shunt resonator 649', which is in an additional shunt circuit. The additional shunt resonator 649' has one end connected between the antenna terminal 115 and first series resonator 642 and an opposite end connected to ground through additional inductor 652. The other series and shunt resonators 641-648, as well as inductors 655-658, may substantially correspond to resonators 241-248 and inductors 255-258 discussed above with respect to FIG. 2, and thus the descriptions will not be repeated with respect to the transmit filter 640a or transmit filter 640b.

In additional representative embodiments, the transmit filters 440 and 540 shown in FIGS. 4 and 5, respectively, may be configured to include a ninth resonator, as a series or shunt resonator, in the same manner depicted in FIGS. 6A and 6B, which reference the transmit filter 240 of FIG. 2. Further, the cross-coupling capacitor 559 in the transmit filter 540 of FIG. 5 may alternately be connected to the node between resonators 541 and 542 and the common ground fifth inductor 560 if first inductor 555 were separately grounded and inductor 558 were joined to second and third inductors 556 and 557 at the ungrounded node of fifth inductor 560. Further, it is understood that with respect to the various embodiments discussed herein, the antenna terminal 115 and the transmitter terminal 150 may have the opposite positions with respect to the layout of the transmit filters, without departing from the scope of the present teachings. Also, in the various embodiments, the sizes and/or values of the resonators and cross-coupled capacitors may vary to provide unique benefits for any particular situation or to meet application specific design requirements of various implementations, as would be apparent to one skilled in the art.

FIGS. 7 and 8 are circuit diagrams of receive filters 720 and 820, respectively, according to additional representative embodiments. Like receive filter 220, discussed above, receive filters 720 and 820 are half-ladder filters with eight resonators and mutual inductance or common ground inductors, and provide substantial rejection below passband, shifting transmission zeros further into the stopband. Receive filters 240, 720 and 820 may also have fast roll-off on the low frequency side. Receive filters 720 and 820 may be incorporated in duplexer 200, for example, in place of receive filter 220. Receive filters 720 and 820 may also be used as stand alone band-pass filters or may be incorporated in multiplexers or other devices.

Referring to FIG. 7, receive filter 720 has a series circuit including first through fourth receive filter series resonators 721-724 connected in series between the antenna terminal 115 and the receiver terminal 130. It is understood that, although not depicted in FIG. 7, a phase shifter or matching circuit is included between node 733 and the antenna terminal 115, depending on implementation and design requirements. The receive filter 720 also has shunt circuits which respectively include first through fourth shunt resonators 725-728 and corresponding first through fourth inductors 735-738 generally connected between the series circuit and ground voltage. The series and shunt resonators 721-728, as well as the first through fourth inductors 735-738, may substantially correspond to resonators 221-228 and inductors 235-238 discussed above with respect to FIG. 2, and thus the descriptions will not be repeated with respect to the receive filter 720.

In the depicted representative embodiment, the receive filter 720 includes a different connection of the common ground inductor 739 than the receive filter 240. In particular, first shunt resonator 725 has one end connected to node 733 and an opposite end connected to mutual inductance node 732 through first inductor 735. Similarly, second shunt resonator 726 has one end connected between second and third series resonators 721 and 722 and an opposite end connected to the mutual inductance node 232 through second inductor 736. The mutual inductance node 732 is connected to ground through mutual or common ground inductor 739.

In another embodiment of a receive filter (not shown), similar to receive filters 220 and 720 in FIGS. 2 and 7, the mutual inductance node (e.g., 732) is connected to the second and third shunt resonators (e.g., 726 and 727) through second and third inductors (e.g., 736 and 737), respectively. As in the other embodiments, the mutual inductance node is connected to ground through a common ground inductor (e.g., 739).

Referring to FIG. 8, receive filter 820 has a series circuit including first through fourth receive filter series resonators 821-824 connected in series between the antenna terminal 115 and the receiver terminal 130. It is understood that, although not depicted in FIG. 8, a phase shifter or matching circuit is included between node 833 and the antenna terminal 115, depending on implementation and design requirements. The receive filter 820 also has shunt circuits which respectively include first through fourth shunt resonators 825-828 and corresponding first through fourth inductors 835-838 generally connected between the series circuit and ground voltage. The series and shunt resonators 821-828, as well as the first through fourth inductors 835-838, may substantially correspond to resonators 221-228 and inductors 235-238 discussed above with respect to FIG. 2, and thus the descriptions will not be repeated with respect to the receive filter 820.

In the depicted representative embodiment, the receive filter 820 includes multiple cross-couplings, as compared to the single cross-coupling of the receive filter 720, discussed above. In particular, the receive filter 820 includes two mutual or common ground inductors 834 and 839, each of which is a cross-coupling inductor. Referring to FIG. 8, first shunt resonator 825 has one end connected to node 833 and an opposite end connected to first mutual inductance node 832 through first inductor 835, and second shunt resonator 826 has one end connected between first and second series resonators 821 and 822 and an opposite end connected to the first mutual inductance node 832 through second inductor 836. Similarly, third shunt resonator 827 has one end connected between second and third series resonators 822 and 823 and an opposite end connected to second mutual inductance node 831 through third inductor 837, and fourth shunt resonator 828 has one end connected between third and fourth series resonators 823 and 824 and an opposite end connected to the second mutual inductance node 831 through fourth inductor 838. The first mutual inductance node 832 is connected to ground through common ground inductor 839, and the second mutual inductance node 831 is connected to ground through second common ground inductor 834. Such an arrangement of multiple cross-coupling circuits provides a filter having a substantially elliptic filter response.

Figure 9A:
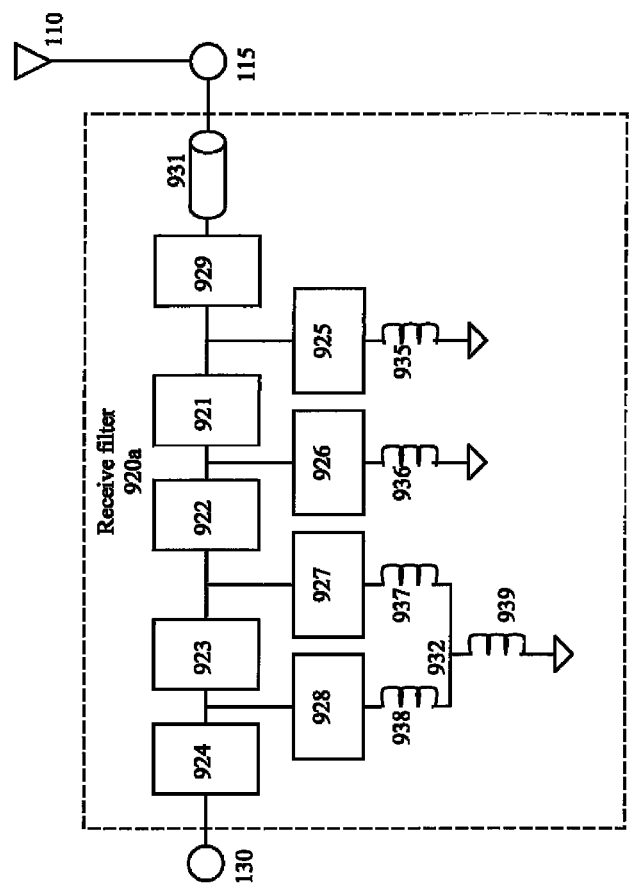
FIGS. 9A and 9B are circuit diagrams illustrating receive resonator filters having nine resonators, according to representative embodiments.
Figure 9B:
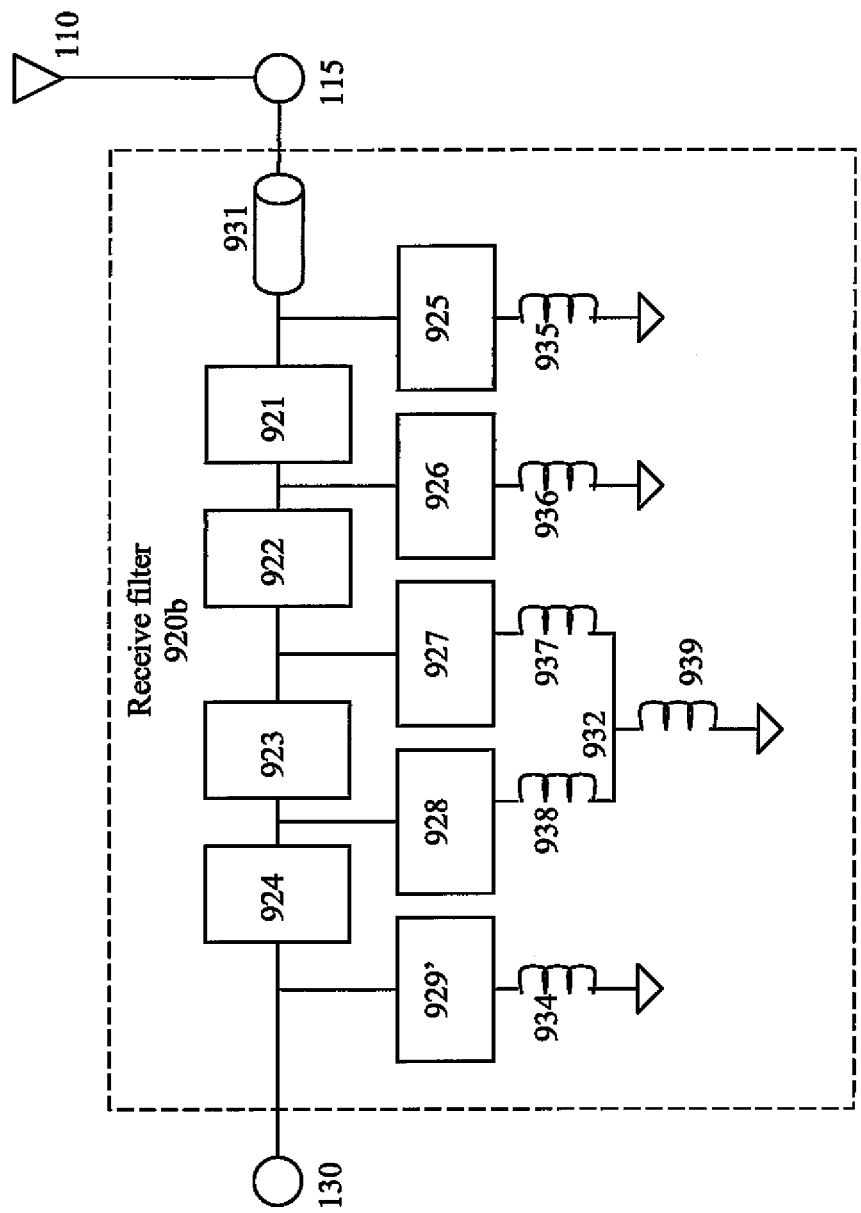

FIGS. 9A and 9B are circuit diagrams of receive filters 920a and 920b, respectively, according to representative embodiments. Receive filters 920a and 920b are half-ladder filters, similar to the receive filter 220, discussed above with reference to FIG. 2, except that each includes an additional (ninth) resonator.

More particularly, referring to FIG. 9A, receive filter 920a includes additional series resonator 929, which is connected in the series circuit between first series resonator 921 and phase shifter 931, which is connected in series with the antenna terminal 115. Referring to FIG. 9B, receive filter 920b includes additional shunt resonator 929', which is in an additional shunt circuit. The additional shunt resonator 929' has one end connected between the receiver terminal 130 and fourth series resonator 924 and an opposite end connected to ground through additional inductor 934. The other series and shunt resonators 921-928, as well as inductors 935-938, may substantially correspond to resonators 241-248 and inductors 255-258 discussed above with respect to FIG. 2, and thus the descriptions will not be repeated with respect to the receive filter 920a or receive filter 920b.

In additional representative embodiments, the receive filters 720 and 820 shown in FIGS. 7 and 8, respectively, may be configured to include ninth series or shunt resonators in the same manner depicted in FIGS. 9A and 9B, which reference the receive filter 240 of FIG. 2. Further, it is understood that with respect to the various embodiments discussed herein, the antenna terminal 115 and the receiver terminal 130 may have the opposite positions with respect to the layout of the receive filters, without departing from the scope of the present teachings. Also, in the various embodiments, the sizes and/or values of the resonators and inductors may vary to provide unique benefits for any particular situation or to meet application specific design requirements of various implementations, as would be apparent to one skilled in the art.

Figure 10A:
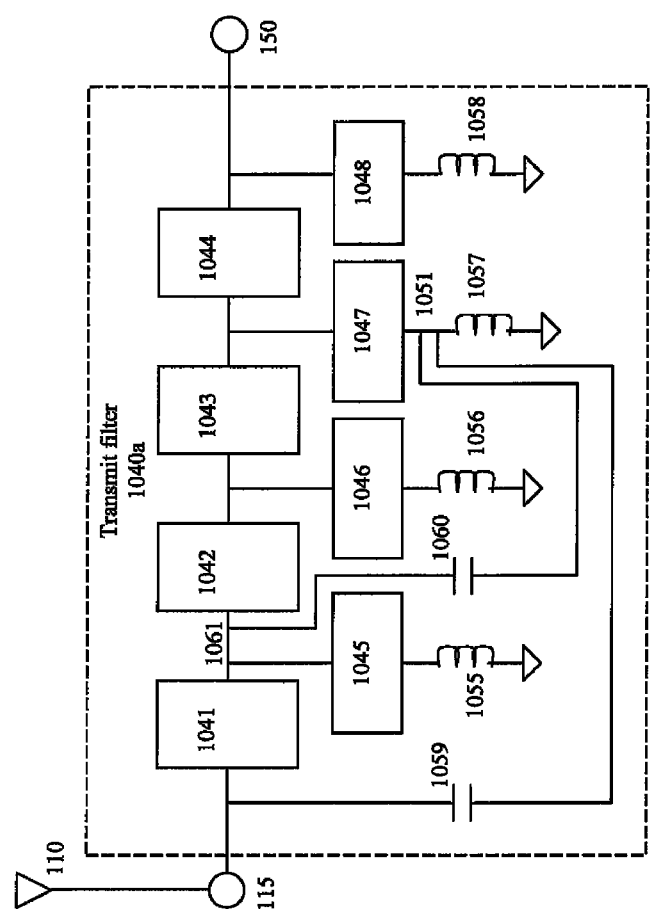
FIGS. 10A and 10B are circuit diagrams illustrating transmit resonator filters having multiple cross-coupling capacitors, according to representative embodiments.
Figure 10B:
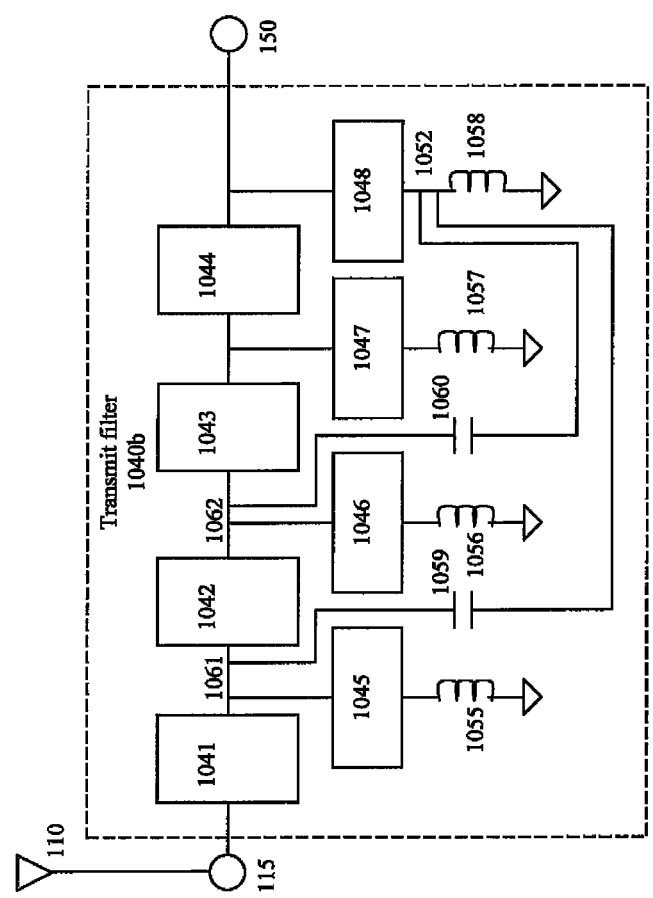

FIGS. 10A and 10B are circuit diagrams illustrating transmit resonator filters having multiple cross-coupling capacitors, according to representative embodiments. Like transmit filter 240, discussed above, transmit filters 1040a and 1040b are half-ladder filters with eight resonators, although each of the transmit filters 1040a and 1040b includes multiple cross-coupling capacitors 1059 and 1060. Generally, in the depicted embodiments, a first cross-coupling capacitor circuit bypasses three consecutive series resonators and a shunt resonator connected to the third series resonator of the bypassed series resonators, while a second cross-coupling capacitor circuit bypasses two of the three consecutive series resonators and the same shunt resonator.

Transmit filters 1040a and 1040b may be incorporated in duplexer 200, for example, in place of transmit filter 240. Transmit filters 1040a and 1040b may also be used as stand alone band-pass filters or may be incorporated in multiplexers or other devices. Further, the configurations of transmit filters 1040a and 1040b do not necessarily need to be used for filtering uplink signals, but rather may be used for filtering downlink signals or in any situation requiring an upward shift of signal transmission zeros.

Referring to FIG. 10A, transmit filter 1040a has a series circuit including first through fourth filter series resonators 1041-1044 connected in series between the antenna terminal 115 (or other output node) and the transmitter terminal 150 (or other input node). The transmit filter 1040a also has shunt circuits which respectively include first through fourth shunt resonators 1045-1048 and corresponding first through fourth inductors 1055-1058 generally connected between the series circuit and ground voltage.

More particularly, in the depicted representative embodiment, first shunt resonator 1045 has one end (e.g., top electrode) connected between first and second series resonators 1041 and 1042, and an opposite end (e.g., bottom electrode)

connected to ground through inductor 1055. Second shunt resonator 1046 has one end connected between second and third series resonators 1042 and 1043 and an opposite end connected to ground through inductor 1056. Third shunt resonator 1047 has one end connected between third and forth series resonators 1043 and 1044 and an opposite end connected to first capacitance node 1051, which is connected to ground through inductor 1057. Fourth shunt resonator 1048, which is connected closest to the transmitter terminal 150, has one end connected between fourth series resonator 1044 and the transmitter terminal 150, and an opposite end connected to ground through inductor 1058.

In addition, the first capacitance node 1051 is connected to two cross-coupling circuits, which respectively include first cross-coupling capacitor 1059 and second cross-coupling capacitor 1060. In the depicted embodiment, the first capacitance node 1051 is connected to the antenna terminal 115 through the first cross-coupling capacitor 1059 and to second capacitance node 1061 through the second cross-coupling capacitor 1060. The second capacitance node 1061 is located between the first and second series resonators 1041 and 1042.

In comparison, the cross-coupling circuits of FIG. 10B are shifted with respect to the series resonators. Referring to FIG. 10B, transmit filter 1040b has a series circuit including first through fourth filter series resonators 1041-1044 connected in series between the antenna terminal 115 and the transmitter terminal 150. The transmit filter 1040b also has shunt circuits which respectively include first through fourth shunt resonators 1045-1048 and corresponding first through fourth inductors 1055-1058 generally connected between the series circuit and ground voltage.

More particularly, in the depicted representative embodiment, first shunt resonator 1045 has one end (e.g., top electrode) connected between first and second series resonators 1041 and 1042, and an opposite end (e.g., bottom electrode) connected to ground through inductor 1055. Second shunt resonator 1046 has one end connected between second and third series resonators 1042 and 1043 and an opposite end connected to ground through inductor 1056. Third shunt resonator 1047 has one end connected between third and fourth series resonators 1043 and 1044 and an opposite end connected to ground through inductor 1057. Fourth shunt resonator 1048, which is connected closest to the transmitter terminal 150, has one end connected between fourth series resonator 1044 and the transmitter terminal 150, and an opposite end connected to first capacitance node 1052, which is connected to ground through inductor 1058.

In addition, the first capacitance node 1052 is connected to two cross-coupling circuits, which respectively include first cross-coupling capacitor 1059 and second cross-coupling capacitor 1060. In the depicted embodiment, the first capacitance node 1052 is connected to second capacitance node 1061 through the first cross-coupling capacitor 1059 and to third capacitance node 1062 through the second cross-coupling capacitor 1060. The second capacitance node 1061 is located between the first and second series resonators 1041 and 1042, and the third capacitance node 1062 is located between the second and third series resonators 1042 and 1043.

Stated more generally, in various embodiments, the first cross-coupling capacitor 1059 connects between a first node (e.g., antenna terminal 115 or second capacitance node 1061), connected to at least one of the series resonators 1041-1044 (e.g., series resonator 1041 or 1042), and a second node connected to one of the shunt resonators 1045-1048 (e.g., shunt resonator 1047 or 1048). Between the first and second nodes, there are three series resonators (e.g., series resonators 1041-1043 or 1042-1044) and one shunt resonator (e.g., shunt resonator 1047 or 1048). The second cross-coupling capacitor 1060 connects between a third node (e.g., second capacitance node 1061 or third capacitance node 1062), connected to at least one of the series resonators 1041-1044 (e.g., series resonator 1042 or 1043), and the second node connected to one of the shunt resonators 1045-1048 (e.g., shunt resonator 1047 or 1048). Between the third and second nodes, there are two series resonators (e.g., series resonators 1042-1043 or 1043-1044) and one shunt resonator (e.g., shunt resonator 1047 or 1048). The second node (e.g., first capacitance node 1051) is separated from the ground voltage by an inductor (e.g., inductor 1057). In other words, the first cross-coupling circuit is configured to bypass n series resonators (n being a whole number) and one shunt resonator, while the second cross-coupling circuit is configured to bypass n−1 series resonators (of the n series resonators) and the same shunt resonator. Such arrangements of multiple cross-coupling circuits provide filters having substantially elliptic filter responses.

In various embodiments, the transmit filter 1040a or 1040b may be included in a duplexer (e.g., duplexer 100), which also includes a receive filter, such as receive filter 220, 720, 820, 920a or 920b of FIGS. 2, 7, 8, 9A and 9B, respectively. Also, in various embodiments, both the transmit and receive filters of the duplexer may include multiple cross-coupling circuits. For example, a representative duplexer may include the transmit filter 1040a or 1040b, having multiple cross-coupling capacitors (e.g., first and second cross-coupling capacitors 1059 and 1060) and the receive filter 820 of FIG. 8, having multiple cross-coupling inductors (mutual or common ground inductors 834 and 839).

Referring to FIGS. 10A and 10B, each of the series and shunt resonators 1041-1048 may be an FBAR, for example, including a thin film piezoelectric layer formed in a stacked structure between top and bottom electrodes. The thin film piezoelectric layer may be formed of a material such as aluminum nitride, PZT or other film compatible with semiconductor processes. In an embodiment, the series and shunt resonators 1041-1048 are fabricated using a common layer of piezoelectric material. Also, in an embodiment, the series and shunt resonators 1041-1048 may be fabricated using a common layer of piezoelectric material. In addition, only two mass-loadings are needed to produce frequency shifts in some of the resonators 1041-1048, as discussed below. The top and bottom electrodes may be formed of any conductive metal compatible with semiconductor processes, such as molybdenum, tungsten, aluminum or the like.

In various embodiments, the series and shunt resonators 1041-1048 of the transmit filters 1040a and 1040b have the same coupling coefficients, and all of the series and shunt resonators 1041-1048 include piezoelectric layers having the same thickness. The coupling coefficients and/or piezoelectric layer thicknesses of the series and shunt resonators 1041-1048 may or may not be the same as those of the series and shunt resonators of a receive filter, when the transmit filter 1040a or 1040b is included in a duplexer. Also, as discussed above, minimum coupling coefficients may be used for the required bandwidth, which enables a thinner piezoelectric layer and therefore smaller die sizes.

Also, as discussed above, only two mass-loadings are needed to produce frequency shifts in some of the series and shunt resonators of transmit and receive filters having multiple cross-couplings, enabling generation of four different frequencies. For example, in the representative embodiment of transmit filter 1040a shown in FIG. 10A, a first (coarse) mass-loading only is applied to second and third shunt resonators 1046 and 1047, a second (smaller) mass-loading only is applied to first, second and third series resonators 1041, 1042 and 1043), first and second mass-loadings are applied to first and fourth shunt resonators 1045 and 1048, and no mass-loadings are applied to fourth series resonator 1044. Likewise, in the representative embodiment of receive filter 820 shown in FIG. 8, first and second mass-loadings are applied to first and fourth shunt resonators 825 and 828, a second mass-loading only is applied to second and third series resonators 822 and 823 and to second and third shunt resonators 826 and 827, and no mass-loadings are applied to first and fourth series resonators 821 and 824.

The first and second cross-coupling capacitors 1059 and 1060 of the transmit filters 1040a and 1040b, together with the inductor connecting to ground (e.g., third or fourth inductor 1057 or 1058), shifts a transmission zero of the transmitted (uplink) signal higher, above the passband of the transmit filter 1040a or 1040b, into the middle of its stopband. The values of the first and second cross-coupling capacitors 1059 and 1060, as well as the value of the inductor 1057 or 1058, determine how far the transmission zero is shifted upward in frequency from the upper passband edge. For example, in an embodiment in which the transmit filter 1040a or 1040b is included in a duplexer, the values of the first and second cross-coupling capacitors 1059 and 1060, and/or the inductor 1057 or 1058, are selected such that the transmission zero will be shifted to be at or near the center frequency of the passband of the receive filter. This frequency placement of transmission zeroes (and poles) achieves near-ideal elliptic filter performance.

Thus, in various embodiments, the sizes and/or values of the resonators, inductors and cross-coupled capacitor may vary to provide unique benefits for any particular situation or to meet application specific design requirements of various implementations, as would be apparent to one skilled in the art. For example, assuming that a center frequency of the passband of the transmit filter 1040a or 1040b is about 887.2 MHz, and that a center frequency of the passband of a corresponding receive filter (in a duplexer configuration) is about 943.3 MHz, the first cross-coupling capacitor 1059 may have a value of about 0.1 pF and the second cross-coupling capacitor 1060 may have a value of about 0.8 pF. The values of the inductors 1055-1058 may be between about 0.3 nH and 0.7 nH (typical wirebond values). Each of the series and shunt resonators 1041-1048 may be an FBAR, having areas in the range of about 1000-100,000 square microns, depending on the frequency and bandwidth requirements of the filters/duplexers and optimized impedance for each particular resonator.

Figure 11:
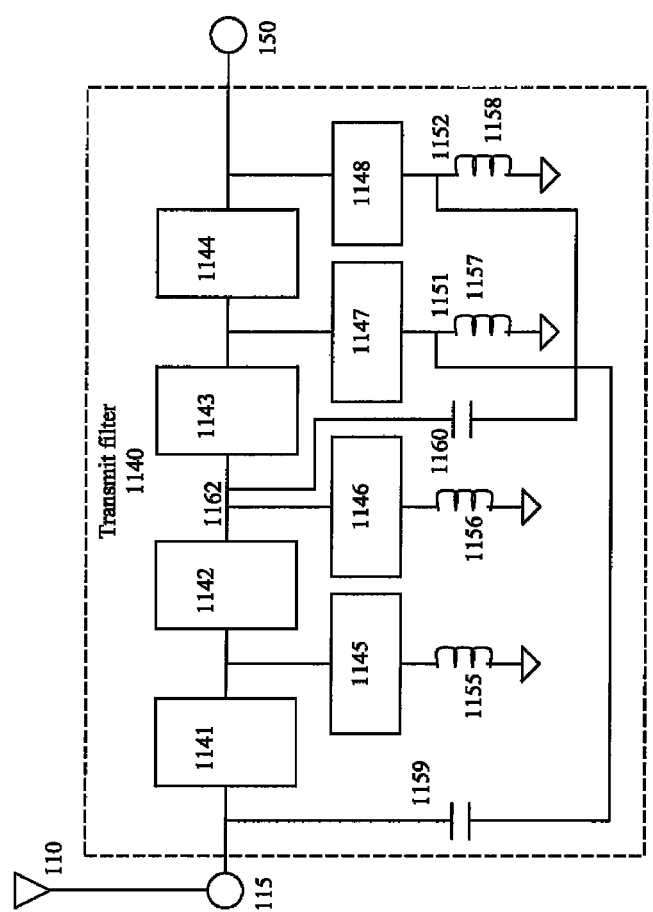
FIG. 11 is a circuit diagram illustrating a transmit resonator filter having multiple cross-coupling capacitors, according to a representative embodiment.

FIG. 11 is a circuit diagram illustrating a transmit resonator filter having multiple cross-coupling capacitors, according to representative embodiments. FIG. 11 shows transmit filter 1140, which is a half-ladder filter, having first and second cross-coupling capacitors 1159 and 1160. Generally, the configuration of transmit filter 1140 is similar to that of transmit filters 1040a and 1040b shown in FIGS. 10A and 10B, in that a first cross-coupling capacitor circuit bypasses three consecutive series resonators and a shunt resonator, and a second cross-coupling capacitor circuit bypasses two consecutive series resonators and a shunt resonator. However, in the embodiment depicted in FIG. 11, the first and second cross-coupling circuits bypass different shunt resonators, and the second cross-coupling circuit bypasses at least one series resonator that is not bypassed by the first cross-coupling circuit.

Transmit filter 1140 may be incorporated in duplexer 200, for example, in place of transmit filter 240. Transmit filter 1140 may also be used as stand alone band-pass filter or may be incorporated in multiplexers or other devices. Further, the configuration of transmit filter 1140 does not necessarily need to be used for filtering uplink signals, but rather may be used for filtering downlink signals or in any situation requiring an upward shift of signal transmission zeros.

Referring to FIG. 11, the transmit filter 1140 has a series circuit including first through fourth series resonators 1141-1144 connected in series between the antenna terminal 115 and the transmitter terminal 150. The transmit filter 1140 also has shunt circuits which respectively include first through fourth shunt resonators 1145-1148 and corresponding first through fourth inductors 1155-1158 generally connected between the series circuit and ground voltage.

More particularly, in the depicted representative embodiment, first shunt resonator 1145 has one end (e.g., top electrode) connected between first and second series resonators 1141 and 1142, and an opposite end (e.g., bottom electrode) connected to ground through inductor 1155. Second shunt resonator 1146 has one end connected between second and third series resonators 1142 and 1143 and an opposite end connected to ground through inductor 1156. Third shunt resonator 1147 has one end connected between third and forth series resonators 1143 and 1144 and an opposite end connected to first capacitance node 1151, which is connected to ground through inductor 1157. Fourth shunt resonator 1148, which is connected closest to the transmitter terminal 150, has one end connected between fourth series resonator 1144 and the transmitter terminal 150, and an opposite end connected to second capacitance node 1152, which is connected to ground through inductor 1158.

In addition, the first capacitance node 1151 is connected to a first cross-coupling circuit, which includes first cross-coupling capacitor 1159 connected between the first capacitance node 1151 and the antenna terminal 115. Thus, the first cross-coupling circuit bypasses three series resonators (first, second and third series resonators 1141, 1142 and 1143) and one shunt resonator (third shunt resonator 1147). The second capacitance node 1152 is connected to a second cross-coupling circuit, which includes second cross-coupling capacitor 1160 connected between the second capacitance node 1152 and third capacitance node 1162, located between the second series resonators 1142 and 1143. Thus, the second cross-coupling circuit bypasses two series resonators (third and fourth series resonators 1143 and 1144) and one shunt resonator (fourth shunt resonator 1148). In other words, the first cross-coupling circuit is configured to bypass n series resonators (n being a whole number) and one shunt resonator, while the second cross-coupling circuit is configured to bypass n−1 series resonators (at least one of which is different from the n series resonators bypassed by the first cross-coupling circuit) and a different shunt resonator.

Various alternative embodiments may include transmit filters having additional cross-coupling capacitors and/or additional (or fewer) series and/or shunt resonators, without departing from the scope of the present teachings. For example, the configurations of the first and second cross-coupling capacitor circuits shown in FIGS. 10A, 10B and 11 may be implemented in transmit filters having nine (or more) resonators, such as five series resonators and four shunt resonators, as shown in FIG. 6A, or four series resonators and five shunt resonators, as shown in FIG. 6B. Likewise, various alternative embodiments may include receive filters having additional cross-coupling inductors and/or additional (or fewer) series and/or shunt resonators, without departing from the scope of the present teachings. For example, the configurations of the first and second cross-coupling inductor circuits shown in FIG. 8 may be implemented in receive filters having nine (or more) resonators, such as five series resonators and four shunt resonators, as shown in FIG. 9A, or four series resonators and five shunt resonators, as shown in FIG. 9B.

In accordance with the various embodiments, all eight poles of the multiple cross-coupling filters may be positioned at nearly ideal locations and all eight zeroes may be positioned at locations improved over conventional filters, achieving a near-perfect roll-off with about −17 dB return loss across the entire passband. This translates into lower insertion loss and less reflected power. Combined with the high quality factors of current FBARs (e.g., having quality factors (Q) of several thousand), the peak current savings to the end user may be equivalent to about ~1 dB improvement in insertion loss (e.g., about 66 mA), when compared with conventional filters.

The improved performance of all the various embodiments discussed above over conventional transmit and receive filters, e.g., for use as stand alone filters or in duplexers, multiplexers and the like, is particularly beneficial where a very fast roll-off from passband to stopband is required, e.g., due to a very narrow guard band, such as in the UMTS band 2 (PCS band), UMTS band 3 (GCS), UMTS band 7 (IMT-E), UMTS band 8 (GSM-900) and 3GPP Bands 13 and 14. Of course, it is understood that various embodiments may be scaled, for example, to cover all UMTS bands, even when fast roll-off is not needed. For example, even when fast roll-off is not needed, the various embodiments enable use of the minimum effective coupling coefficient and piezoelectric layer (e.g., AlN) thickness to achieve a given bandwidth, resulting in minimum resonator areas of a given impedance, leading to smaller dice and lower cost.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A half-ladder filter having a passband, the filter comprising:
a plurality of series resonators connected in series between an input node and an output node;
a plurality of shunt resonators respectively connected between a least one of the series resonators and a ground voltage; and
a plurality of cross-coupling circuits comprising a corresponding plurality of capacitors, each cross-coupling circuit bypassing at least two series resonators of the plurality of series resonators and at least one shunt resonator of the plurality of shunt resonators,
wherein the plurality of cross-coupling circuits cause a transmission zero to shift higher in frequency from an upper edge of the passband of the filter.

2. A filter device for filtering signals, the filter device comprising:
a plurality of series resonators connected in series between an antenna and one of a transmitter or a receiver;
a plurality of shunt resonators respectively connected between at least one of the series resonators and a ground voltage; and
a plurality of cross-coupling circuits configured to bypass at least two series resonators of the plurality of series resonators and at least one shunt resonator of the plurality of shunt resonators, the plurality of cross-coupling circuits comprising: a first cross-coupling circuit configured to bypass n series resonators of the plurality of series resonators, and one shunt resonator of the plurality of shunt resonators, wherein n is a whole number; and a second cross-coupling circuit configured to bypass n−1 series resonators of the plurality of series resonators and one shunt resonator of the plurality of shunt resonators, wherein each of the plurality of cross-coupling circuits comprises a capacitor connected between a corresponding first node, connected to at least one of the bypassed series resonators, and a second node, connected to the bypassed shunt resonator, the second node being connected to ground through an inductor.

3. The filter device of claim 2, wherein the plurality of cross-coupling circuits are connected to the same second node.

4. The duplexer of claim 2, wherein each of the first and second series resonators and the first and second shunt resonators comprises a film bulk acoustic resonator (FBAR), formed using no more than two mass-loadings.

5. The filter device of claim 2, wherein the first cross-coupling circuit comprises a first capacitor and the second cross-coupling circuit comprises a second capacitor.

6. The filter device of claim 5, wherein the n−1 series resonators bypassed by the second cross-coupling circuit are included among the n series resonators bypassed by the first cross-coupling circuit.

7. The filter device of claim 5, wherein the one shunt resonator bypassed by the second cross-coupling circuit is the same as the one shunt resonator bypassed by the first cross-coupling circuit.

8. The filter device of claim 5, wherein the one shunt resonator bypassed by the second cross-coupling circuit is different from the one shunt resonator bypassed by the first cross-coupling circuit.

9. The filter device of claim 2, wherein a first shunt resonator is connected at one end between a first series resonator and a second series resonator, a second shunt resonator is connected at one end between the second series resonator and a third series resonator, a third shunt resonator is connected at one end between the third series resonator and a fourth series resonator, and a fourth shunt resonator is connected at one end between the fourth series resonator and the one of the receiver or the transmitter.

10. The filter device of claim 9, wherein a first cross-coupling circuit comprises a first capacitor having one end connected between the antenna and the first series resonator, and another end connected to the third shunt resonator, and
wherein a second cross-coupling circuit comprises a second capacitor having one end connected between the first series resonator and the second series resonator, and another end connected to the third shunt resonator.

11. The filter device of claim 9, wherein a first cross-coupling circuit comprises a first capacitor having one end connected between the first series resonator and the second series resonator, and another end connected to the fourth shunt resonator, and
wherein a second cross-coupling circuit comprises a second capacitor having one end connected between the second series resonator and the third series resonator, and another end connected to the fourth shunt resonator.

12. The filter device of claim 9, wherein a first cross-coupling circuit comprises a first capacitor having one end connected between the antenna and the first series resonator, and another end connected to the third shunt resonator, and
wherein a second cross-coupling circuit comprises a second capacitor having one end connected between the second series resonator and the third series resonator, and another end connected to the fourth shunt resonator.

13. The duplexer of claim 2, wherein the first and second series resonators and the first and second shunt resonators have the same coupling coefficient.

14. A filter device for filtering signals, the filter device comprising:
- a plurality of series resonators connected in series between an antenna and one of a transmitter or a receiver;
- a plurality of shunt resonators respectively connected between at least one of the series resonators and a ground voltage; and
- a plurality of cross-coupling circuits configured to bypass at least two series resonators of the plurality of series resonators and at least one shunt resonator of the plurality of shunt resonators, wherein each of the plurality of cross-coupling circuits comprises a capacitor connected between a corresponding first node, connected to at least one of the bypassed series resonators, and a second node, connected to the bypassed shunt resonator, the second node being connected to ground through an inductor.

15. A duplexer interfacing a receiver and a transmitter with a common antenna, the duplexer comprising:
- a first filter comprising a plurality of first series resonators connected in series between the antenna and one of the receiver or the transmitter, a plurality of first shunt resonators respectively connected between at least one of the first series resonators and a ground voltage, and a plurality of first cross-coupling circuits; and
- a second filter comprising a plurality of second series resonators connected in series between the antenna and one of the transmitter or the receiver, a plurality of second shunt resonators respectively connected between at least one of the second series resonators and the ground voltage, and a plurality of second cross-coupling circuits, wherein the plurality of first cross-coupling circuits includes a corresponding plurality of inductors, each inductor being connected between at least two of the first shunt resonators and the ground voltage, wherein the first filter has a first passband, the plurality of first cross-coupling circuits causing a first transmission zero to shift lower in frequency from a lower edge of the first passband.

16. The duplexer of claim 15, wherein the plurality of second cross-coupling circuits includes a corresponding plurality of capacitors, each second cross-coupling circuit bypassing at least two of the plurality of second series resonators and one of the plurality of second shunt resonators.

17. The duplexer of claim 16, wherein the second filter has a second passband, the plurality of second cross-coupling circuits causing a second transmission zero to shift higher in frequency from an upper edge of the second passband.

18. The filter device of claim 17, wherein a first shunt resonator is connected at one end between a first series resonator and a second series resonator, a second shunt resonator is connected at one end between the second series resonator and a third series resonator, a third shunt resonator is connected at one end between the third series resonator and a fourth series resonator, and a fourth shunt resonator is connected at one end between the fourth series resonator and the one of the receiver or the transmitter.

19. The filter device of claim 18, wherein a first cross-coupling circuit comprises a first capacitor having one end connected between the antenna and the first series resonator, and another end connected to the third shunt resonator, and
wherein a second cross-coupling circuit comprises a second capacitor having one end connected between the first series resonator and the second series resonator, and another end connected to the third shunt resonator.

20. The filter device of claim 18, wherein a first cross-coupling circuit comprises a first capacitor having one end connected between the first series resonator and the second series resonator, and another end connected to the fourth shunt resonator, and
wherein a second cross-coupling circuit comprises a second capacitor having one end connected between the second series resonator and the third series resonator, and another end connected to the fourth shunt resonator, 21. The filter device of claim 18, wherein a first cross-coupling circuit comprises a first capacitor having one end connected between the antenna and the first series resonator, and another end connected to the third shunt resonator, and
wherein a second cross-coupling circuit comprises a second capacitor having one end connected between the second series resonator and the third series resonator, and another end connected to the fourth shunt resonator.

* * * * *